LOW NOISE CRYSTAL DIODE MIXER

Filed Oct. 3, 1958

INVENTOR:
HARRY J. PEPPIATT,
BY Joseph P. Kates
HIS ATTORNEY.

INVENTOR:
HARRY J. PEPPIATT,
BY Joseph P. Kates
HIS ATTORNEY.

3,092,774
LOW NOISE CRYSTAL DIODE MIXER
Harry J. Peppiatt, Camillus, N.Y., assignor to General Electric Company, a corporation of New York
Filed Oct. 3, 1958, Ser. No. 765,111
8 Claims. (Cl. 325—445)

The present invention relates to a crystal diode receiver mixer and more particularly relates to a low-noise crystal diode receiver mixer which can be used at any frequency which can tolerate the use of coaxial lines, ground plane transmission lines such as "stripline" or "microstrip" or similar TEM transmission lines.

Prior art devices, for example, the device of Atwood et al., Patent No. 2,469,222 for Crystal Rectifier Converter, issued May 3, 1949, and the device of R. A. Braden for Balanced Microwave Detector, Patent No. 2,550,524, issued April 24, 1951, relied upon a balance principle and did not provide for optimum performance of the crystal diode mixer, for example, in the VHF, UHF, and SHF frequency range. Such devices did not have a noise figure suitable for present day long range radar and communication systems. Also, the noise figure of prior art receivers was not sufficiently low to benefit from the low atmospheric noise which present day antennae operate from. Prior art devices also did not provide for the additional advantage of use of image and harmonic frequency energy, optimum RF impedance mismatch, optimum isolation between the RF and IF stages and for isolation between the incoming radio frequency signal and the local oscillator circuit.

The method and means of the present invention overcome these and other deficiencies of the prior art and in addition provide for a low-noise crystal diode receiver mixer which utilizes techniques to provide for optimum use of image and harmonic frequency termination, impedance mismatch, isolation between RF and IF circuits and between incoming RF signals and local oscillator circuits so as to give a superior noise figure equivalent to increase in the power radiated by a transmitter while providing minimum conversion loss and proper impedance mismatch for optimum noise figure and is adaptable for use in ground plane transmission lines such as "microstrip" and "stripline" and to any other TEM mode type transmission line.

Accordingly, an object of the present invention is to provide a low-noise crystal diode receiver mixer which can be used at any frequency that can tolerate the use of coaxial, "stripline," "microstrip" or similar TEM transmission lines.

Another purpose of the present invention is to provide a low-noise crystal diode receiver mixer circuit wherein adjustment for optimum use of image and harmonic frequency energy can be made.

Another aim of the present invention is to provide a low-noise crystal diode receiver mixer wherein adjustment for optimum radio frequency impedance mismatch may be made.

Another object of the present invention is to provide a low-noise crystal diode receiver mixer which provides optimum isolation between the radio frequency and intermediate frequency circuits.

Another purpose of the present invention is to provide a low-noise crystal diode receiver mixer which provides isolation between incoming radio frequency signals and the local oscillator circuit.

Another object of the present invention is to provide for optimum performance of a crystal diode mixer in the very high frequency, ultra high frequency, and super high frequency ranges.

Another aim of the present invention is to provide a low-noise crystal diode receiver mixer which will provide for a considerable decrease in noise figure equivalent to a considerable increase in the power radiated by the transmitter, and which will be particularly adaptable to scatter systems which require extremely sensitive receivers.

Another purpose of the present invention is to provide a low-noise crystal diode receiver mixer for use where the receiving antenna sees a cool atmosphere compared to that of a conventional receiving antenna so that an improvement in noise figure is even more significant.

Another aim of the present invention is to provide a low-noise crystal diode receiver mixer which will give useful output from the image and sum frequencies thereby providing minimum conversion loss, which will provide for impedance mismatch at the input of the mixer to achieve optimum noise figure and which will provide for improved local oscillator injection and wherein reduction of dissipation loss is effected to a point where it is an insignificant contribution to the noise figure.

While the novel and distinctive features of the invention are particularly pointed out in the appended claims, a more expository treatment of the invention, in principle and in detail, together with additional objects and advantages thereof, is afforded by the following description and accompanying drawings in which:

Figure 1:
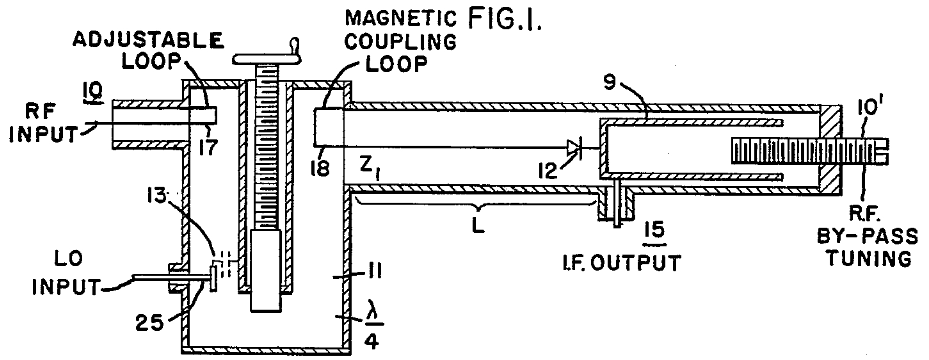
FIG. 1 is a schematic representation of an embodiment of the mixer of the invention using coaxial transmission lines.

Referring to the drawings and in particular to FIG. 1 radio frequency input is received at 10 into a quarter wavelength coaxial cavity 11 tuned to the incoming signal frequency (RF or radio frequency). The signal may be passed with negligible loss through the cavity 11 to a crystal mixer or detector 12. A local oscillator signal from a local oscillator (not shown) may be coupled to the cavity 11 through capacitance coupling 13 schematically represented in dashed lines. Because the capacitance provided by the local oscillator probe 25 in the cavity is small decoupling of the radio frequency input from the local oscillator circuit occurs. That is, the small amount of capacitance causes considerable capacitive reactance at the RF signal input frequency and therefore RF leakage into the local oscillator is blocked because of the method of injection of the local oscillator energy. However, enough local oscillator energy must be generated to enable coupling of a sufficient amount into the cavity at the local oscillator frequency. The radio frequency input and the local oscillator input are at frequencies which are relatively narrowly separated. Because it is important that none of the radio frequency input (which can be very small) be lost, the capacitance of capacitive input coupling from the local oscillator must be of small capacitance such that there will be substantially no loss of RF energy into the local oscillator input. That is, there must be large capacitive reactance so that flow of RF energy into the local oscillator circuit will be blocked. Since power output of the local oscillator is a controllable factor, a much greater amount of power input from the local oscillator then would be required if optimum input coupling for merely local oscillator input reasons were employed is necessary so that although low input coupling efficiency from the local oscillator results, there is also substantially no coupling of RF input to the local oscillator input circuit and therefore substantially all the radio frequency energy input is propagated to the mixer along line L.

A radio frequency bypass filter 9 which may comprise a $\lambda/4$ line open circuited at one end may be provided to produce an extremely low radio frequency voltage at the IF output 15. The radio frequency bypass filter 9 may be tuned by means of the small lumped capacity provided by a screw 10′ which projects inside but is insulated by air from the center conductor of the RF bypass filter 9. The RF bypass tuning adjustment device 10′ may be adjusted to change the length of $\lambda/4$ with change of the radio frequency input to be acquired. The method used may be to adjust the RF bypass tuning means 10′ without the crystal in the circuit until there is no RF input at the IF (intermediate frequency) output. The local oscillator signal from the local oscillator input 13 and the radio frequency signal from the radio frequency input 10 are mixed at the crystal 12 and produce the intermediate frequency signal which appears at the intermediate frequency output lead 15. An adjustable loop 17 and an additional loop 18 are provided at the cavity 11 to provide for an impedance mismatch at the input of the mixer to achieve optimum noise figure by adjusting the orientation and size of the coupling loop 17 in the quarter wavelength cavity 11. It is assumed that the crystal impedance is resistive and that the characteristics impedance $Z_1$ of line L is made equal to it which is not difficult in practice.

The image frequency energy $(2f_{LO}-f_{rf})$ and sum or harmonic frequency energy $(f_{rf}+f_{LO})$ are also produced at the crystal 12 and propagate back toward the quarter wavelength cavity 11. The length of line L can be adjusted such that when these signals are reflected from the cavity and mix again they add to the useful intermediate frequency output. It can be shown that open circuit (really a short at the cavity) image and sum or harmonic terminations at the crystal 12 are best for minimum conversion loss. Optimum adjustment of minimum conversion loss can be obtained accurately by experiment.

Figure 5:
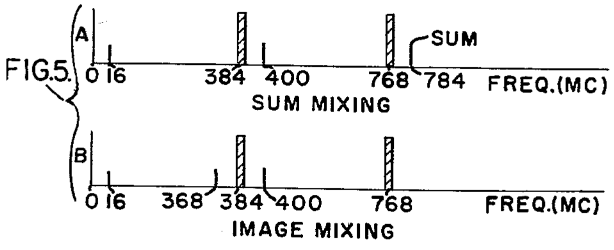
FIG. 5 (A) and (B) are graphical representations which may be utilized to describe sum mixing and image mixing to facilitate understanding of the use of this energy effected by the inventive circuit.

Refer now to FIG. 5 (A) and (B) which give a graphical presentation of sum mixing and image mixing, respectively. Assume, for example, a local oscillator frequency of 384 mc. and a radio frequency incoming signal of 400 mc. The difference which will be the intermediate frequency will be 16 mc. However, at the crystal will appear the second harmonic of the local oscillator frequency or 768 mc. as shown in FIG. 5 (A). In addition, there will appear the sum frequency of the local oscillator frequency 384 mc. and the incoming radio frequency of 400 mc. to give a sum frequency at the local oscillator of 784 mc. Subtracting the second harmonic of the local oscillator frequency of 768 mc. from the sum frequency of 784 mc. representing the sum of the local oscillator frequency of 384 mc. and the radio frequency of 400 mc. will give a difference of 16 mc. which sum mixing energy is desired to be recovered to increase the amount of intermediate frequency energy at the intermediate frequency output 15.

As for the image mixing energy assuming that the local frequency is 384 mc. and that the RF signal is at 400 mc. then an IF output consisting of the difference frequency will occur at 16 mc. It may be noted that the second harmonic of the local oscillator frequency will be at 768 mc. which when mixed with the 400 mc. RF signal and the difference taken will give 368 mc. frequency energy. The 368 mc. image frequency when mixed with the 384 mc. local oscillator will again provide a difference frequency of 16 mc. This image mixing frequency energy is also desirable to be produced at the IF output 15. This is provided for as follows:

The RF bypass filter 9 causes reflection of this energy back to the $\lambda/4$ cavity 11 where it is re-reflected back to the crystal. The RF bypass tuning device 10′ is adjusted without the crystal being in the circuit until no RF input at the IF output takes place. Now if the length L is carefully adjusted the RF bypass filter will be a short to radio frequencies and the IF energy of the sum and image frequencies are propagated back to the cavity 11 from whence if the length L is correctly adjusted they will be again propagated toward crystal 12 and passed into the IF output 15.

As stated, there must also be an impedance mismatch at the input of the mixer 12 if the optimum noise figure is to be realized. This impedance mismatch can be achieved in this mixer by adjusting the orientation and size of the coupling loop 17 in the $\lambda/4$ cavity 11. For this purpose it is assumed that the crystal impedance is resistive and the characteristic impedance $Z_1$ of line L is made equal to this impedance which is not difficult. It should, however, be stated that this would not work if lumped capacitance bypassing were utilized as noise would be introduced thereby into the IF stage, a condition which the RF filter bypass 9 avoids.

Figure 2:
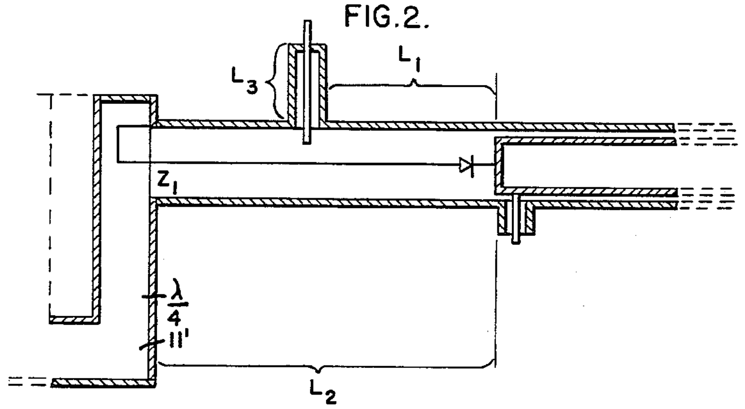
FIG. 2 is a schematic representation of the inventive mixer showing a second embodiment of the transmission line incorporating means to reflect image and sum frequency energy.

Referring now to the alternative form of FIG. 2 as has been stated the above-described mixer can be built in ground plane transmission line or any other TEM mode transmission lines. Better performance can be obtained with the device of FIG. 2 with the line (L in FIG. 1) modified as shown. Line L3 may be a coaxial stub which reflects the harmonic signal but has as little effect as possible on the image signal. Length L1 may be adjusted to give optimum harmonic frequency termination. The $\lambda/4$ cavity 11′ will reflect the image signal and the length L2 may be adjusted to give optimum image termination.

Referring now to the embodiment of FIG. 3 improved performance may be effected as follows:

It has been found that if the local oscillator injection generally designated at 23 is placed in the high impedance line L4 about ½ of the way between the $\lambda/4$ cavity 21 and the crystal 22, this mode of injection will provide more isolation of the signal from the local oscillator circuit for a given amount of local oscillator power. In the device of FIG. 1, a large portion of the local oscillator power was used to overcome the insertion loss (loss due to reactance) of the cavity since the cavity is tuned to the signal input frequency. By injection of local oscillator energy into the high impedance line, it is found that substantially more isolation of the RF and LO circuits is possible for a given amount of LO power. At one critical point designated 60, it might not be possible to inject enough energy for proper operation. This is to be avoided in utilizing this equipment.

Figure 3:
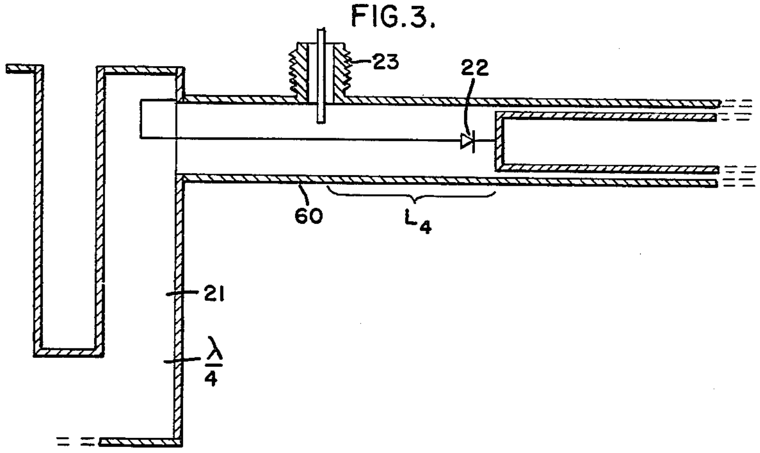
FIG. 3 is a schematic representation of another embodiment of the mixer of the present invention showing local oscillator feed injection in a preferred form.
Figure 4:
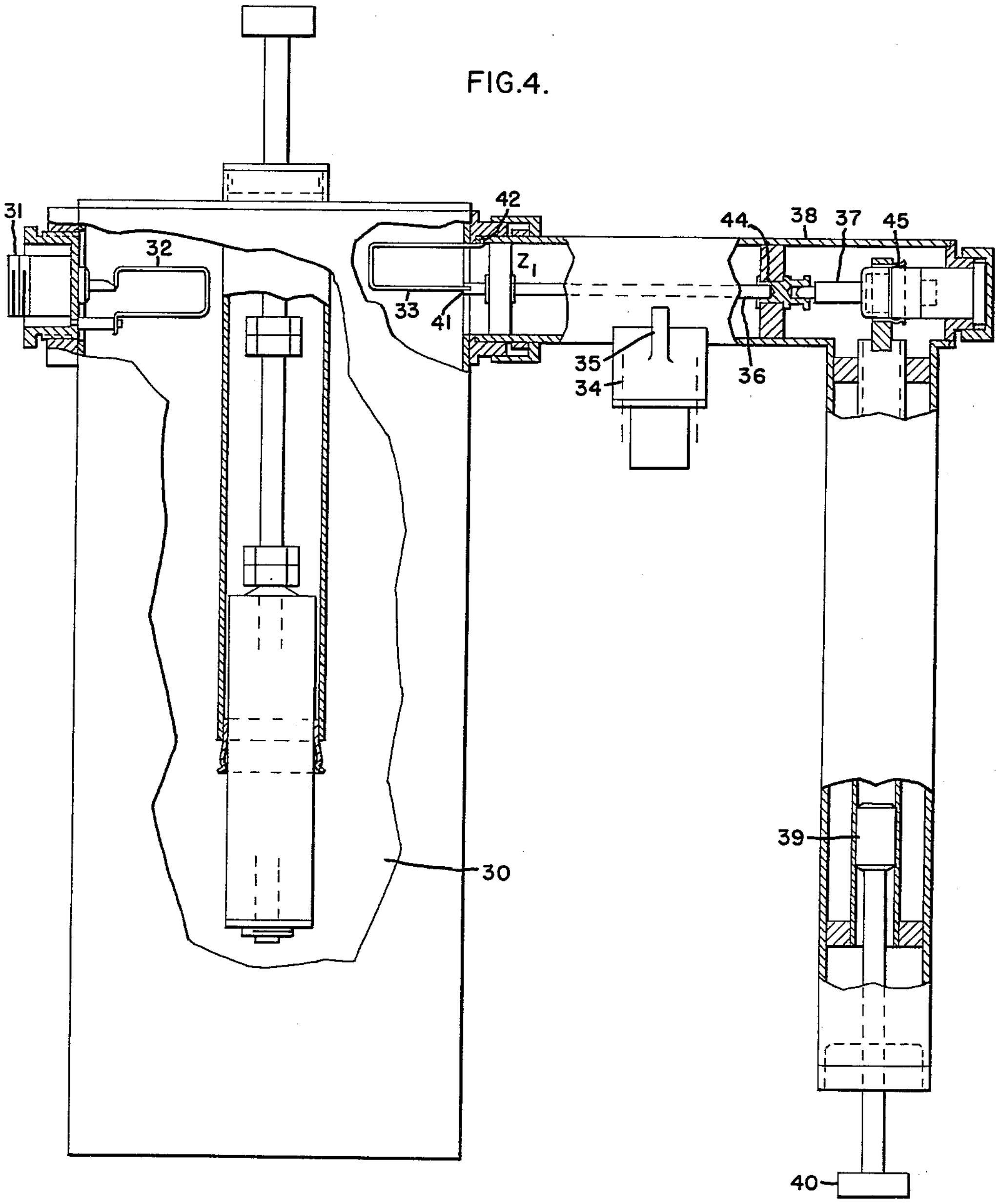
FIG. 4 is a side elevational view of a physical embodiment of the inventive apparatus with parts cut away for purposes of clarity of presentation.

Referring now to FIG. 4 of the drawings there is shown a physical representation of a working embodiment of the invention, the local oscillator injection in this illustrative embodiment being approximately midway between the resonant cavity and the mixer as in FIG. 3. The cavity resonator generally designated at 30 may have RF input means 31. The adjustable coupling loop 32 may be disposed at one side of the resonant cavity 30 and the magnetic coupling loop 33 may be disposed at the other side of resonant cavity 30. Local oscillator input may be injected from a local oscillator (not shown) to the injection means 34 and injection may be actually made by means of a probe 35. In the coaxial line version shown in FIG. 4, the center cable 36 may be disposed between the resonant cavity 30 and the crystal 37. Outer conductor 38 is the outer conductor of the coax (coaxial line). The bypass tuning capacitor 39 may physically be embodied in the form of a sleeve and adjustable means 40 may be provided for a purpose similar to that of RF bypass tuning means 10' of FIG. 1. The magnetic coupling loop 33 may be soldered to the inner conductor at 41 and fastened to the outer conductor at 42. Positioning means 44 and spring means 45 may be provided to position and retain the crystal mixer 37.

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. The appended claims are therefore intended to cover and embrace any such modifications within the limits only of the true spirit and scope of the invention.

What is claimed is:

1. A low noise crystal mixer circuit comprising a resonant cavity tuned to incoming radio frequency energy input, a crystal diode mixer, a transmission line coupled to said resonant cavity, said mixer being positioned in said transmission line whereby radio frequency energy from said resonant cavity is transmitted to said mixer, means to inject local oscillator frequency energy to be propagated by said transmission line, said last-named means comprising means to prevent substantial loss of RF input energy, IF output means disposed at the output of said mixer, and open circuit image harmonic terminations means at said mixer whereby conversion may be effected with minimum conversion loss.

2. The apparatus of claim 1 including means to provide an impedance mismatch at the input of said mixer to provide optimum noise figure.

3. The apparatus of claim 2, said mismatch means comprising a resonant cavity adjustable coupling loop such that impedance mismatch can be achieved by adjusting the orientation and size of said coupling loop.

4. The apparatus of claim 1 wherein said local oscillator input means comprises a probe disposed in said resonant cavity and positioned such that relatively low capacitive coupling is provided so that radio frequency passage into the local oscillator input is substantially blocked but whereby when sufficient local oscillator input energy is introduced coupling will be provided through said capacitance to thereby permit propagation of said radio frequency input and said local oscillator input into said mixer to provide intermediate frequency output.

5. The apparatus of claim 1 wherein said local oscillator input is disposed at a point approximately midway between said mixer and said resonator such that maximum input coupling of local oscillator energy is permitted while precluding escape of the radio frequency energy into the local oscillator input means.

6. The apparatus of claim 1 wherein said transmission line comprises a first means to re-reflect the sum energy reflected from the mixer and a second means to re-reflect the image frequency reflected from the mixer to thereby provide for optimum harmonic frequency and optimum image frequency termination.

7. The apparatus of claim 6 wherein said means for reflecting the harmonic signal comprises a co-axial stub and wherein the location of said stub may be adjusted lengthwise to give optimum harmonic frequency termination.

8. The apparatus of claim 3 wherein said cavity is adjusted at unloaded Q to a level sufficiently high to reduce the power dissipation loss to a point where it is an insignificant contribution to the noise figure of said mixer circuit.

References Cited in the file of this patent

UNITED STATES PATENTS

| | | |
|---|---|---|
| 2,142,159 | Southworth et al. | Jan. 3, 1939 |
| 2,402,663 | Ohl | June 25, 1946 |
| 2,476,885 | McClellan | July 19, 1949 |
| 2,603,754 | Hanson | July 15, 1952 |
| 2,616,037 | Wheeler et al. | Oct. 28, 1952 |
| 2,664,502 | Roberts | Dec. 29, 1953 |
| 2,834,876 | Pritchard et al. | May 13, 1958 |

OTHER REFERENCES

"Microwave Receivers," by Van Voorhis, MIT Radiation Laboratory Series, 1948; only page 13 cited.

"Microwave Mixers," by Pound, MIT Radiation Laboratory Series, 1948; only pages 75 to 87 cited.